(12) United States Patent
Zeller et al.

(10) Patent No.: US 7,338,205 B2
(45) Date of Patent: Mar. 4, 2008

(54) TEMPERATURE MONITORING SYSTEM

(75) Inventors: Thomas Zeller, Sindelfingen (DE); Tanja Finke-Behrend, Bielefeld (DE)

(73) Assignee: Trumpf Laser- und Systemtechnik GmbH, Ditzingen (DE)

( * ) Notice: Subject to any disclaimer, the term of this patent is extended or adjusted under 35 U.S.C. 154(b) by 0 days.

(21) Appl. No.: 11/562,101

(22) Filed: Nov. 21, 2006

(65) Prior Publication Data

US 2007/0147471 A1 Jun. 28, 2007

Related U.S. Application Data

(63) Continuation of application No. PCT/EP2005/005427, filed on May 19, 2005.

(30) Foreign Application Priority Data

May 21, 2004 (DE) ............... 10 2004 024 955

(51) Int. Cl.
*G01K 7/00* (2006.01)

(52) U.S. Cl. ............... 374/179; 374/141; 136/221

(58) Field of Classification Search ............... 374/179
See application file for complete search history.

(56) References Cited

U.S. PATENT DOCUMENTS 3,395,050 A * 7/1968 Senbokuya ............... 136/221
4,242,148 A * 12/1980 Remmert ............... 136/221
4,795,498 A * 1/1989 Germanton et al. ........ 136/225
5,370,459 A 12/1994 Culbertson et al.
5,411,600 A * 5/1995 Rimai et al. ............... 136/225
6,152,597 A 11/2000 Potega
2002/0071475 A1 6/2002 Betzner et al.

FOREIGN PATENT DOCUMENTS

| DE | 219 282 | 2/1985 |
|---|---|---|
| DE | 3939165 | 10/1990 |
| DE | 44 27 181 | 2/1996 |
| DE | 19913195 | 10/2000 |
| DE | 19923014 | 11/2000 |
| DE | 102 19 011 | 11/2003 |

OTHER PUBLICATIONS

Search Report for corresponding European Application Serial No. PCT/EP2005-005427, mailed Sep. 7, 2005.

* cited by examiner

*Primary Examiner*—Gail Verbitsky
*Assistant Examiner*—Mirellys Jagan
(74) *Attorney, Agent, or Firm*—Fish & Richardson P.C.

(57) ABSTRACT

A system for monitoring the temperature of a component includes a temperature sensor that is in thermal contact with the component. The temperature sensor includes a thermocouple and connecting lines. The thermocouple is mounted in an electrically conducting fashion onto a flexible printed circuit board tape in which the connecting lines are integrated. The component is a mirror and the flexible printed circuit board tape is disposed as an electrical insulator between the thermocouple and the mirror.

22 Claims, 2 Drawing Sheets

TEMPERATURE MONITORING SYSTEM

CROSS REFERENCE TO RELATED APPLICATION

This application is a continuation of and claims priority under 35 U.S.C. §120 to PCT Application No. PCT/EP2005/005427, filed on May 19, 2005, which claimed priority to German Application No. DE 10 2004 024 955.5, filed on May 21, 2004. The contents of both of these priority applications are hereby incorporated by reference in their entirety.

TECHNICAL FIELD

The invention relates to a system for monitoring the temperature of a component, and to a gas laser resonator including a temperature monitoring system of this type for at least one mirror of the gas laser resonator.

BACKGROUND

U.S. Publication No. 2002/071475 A1 describes a temperature monitoring device that includes a flexible printed circuit board having a base area at the proximal end and a measuring area at the distal end, a sensor circuit including several strip conductors that are mounted onto the printed circuit board and terminate in the base area in the form of tracepads, and a connection for contacting the tracepads. A sensor is mounted in the measuring area and is electrically connected to the strip conductors.

German Published Patent Application No. DE 44 27 181 A1 discloses a device for fixing the measuring head of a thermocouple to a compound. The measuring head is mounted closely to the component by means of a strip and is either mounted on the surface of the strip facing away from the component by means of a holding foil or disposed in a bore of the strip.

SUMMARY

In one general aspect, the invention features systems that monitor the temperature of a component such as a mirror. The systems include a temperature sensor in thermal contact with the component. The temperature sensor includes a thermocouple and connecting lines. The thermocouple is mounted in an electrically conducting fashion onto a flexible printed circuit board tape in which the connecting lines are integrated. The flexible printed circuit board is disposed as an electrical insulator between the thermocouple and the component.

Implementations can include one or more of the following features. For example, the component can be a mirror. The thermocouple can be an SMD component that is mounted to exposed contact surfaces of the flexible printed circuit board tape. The thermocouple can be soldered to exposed contact surfaces of the flexible printed circuit board tape.

The flexible printed circuit board tape can be formed from a material that does not gas out or release gas. The flexible printed circuit board tape can be formed from Teflon® brand polytetrafluoroethylene (PTFE). The thermocouple can be a PT100 (platinum resistance thermometer) thermocouple.

The temperature monitoring system can include a connector at an end of the flexible printed circuit board tape.

The connecting lines can extend as strip conductors on the flexible printed circuit board tape, and the strip conductors can be provided with an electrically insulating coating except at electric contact points with the thermocouple. The electrically insulating coating can include a resist.

The temperature monitoring system can include a spring element that presses the temperature sensor towards the mirror. The temperature monitoring system can include a temperature monitoring device that receives a signal from the thermocouple, compares the thermocouple signal with a reference value, and issues an error signal if the signal exceeds the reference value. The temperature monitoring system can include a connector provided at an end of the flexible printed circuit board tape and coupled to the temperature monitoring device.

In another general aspect, the invention features gas laser resonators that include a mirror, and a system for monitoring the temperature of the mirror. The system includes a temperature sensor in thermal contact with the mirror, and the temperature sensor includes a thermocouple and connecting lines. The thermocouple is mounted in an electrically conducting fashion onto a flexible printed circuit board tape in which the connecting lines are integrated and the flexible printed circuit board tape is disposed as an electrical insulator between the thermocouple and the mirror.

Implementations can include one or more of the following features. For example, the temperature sensor can be in thermal contact with a rear side or a circumferential area of the mirror.

The gas laser resonator can include additional mirrors, and a temperature monitoring system for each of the additional mirrors.

Each mirror can be associated with a temperature sensor of the temperature monitoring system. The temperature monitoring systems can include a temperature monitoring device that receives a signal from the thermocouple, compares the thermocouple signal with a reference value, and issues an error signal if the signal exceeds the reference value.

In another general aspect, the invention features a method for monitoring the temperature of a mirror. The method includes integrating connecting lines of a temperature sensor into a flexible printed circuit board tape, mounting a thermocouple of the temperature sensor in an electrically conducting fashion onto the flexible printed circuit board tape, placing the temperature sensor in thermal contact with the mirror, and disposing the flexible printed circuit board tape as an electrical insulator between the thermocouple and the mirror.

Implementations can include one or more of the following features. For example, the thermocouple can be mounted onto the flexible printed circuit board tape by mounting the thermocouple to exposed contact surfaces of the flexible printed circuit board tape.

The method can also include attaching a connector at an end of the flexible printed circuit board tape. The method can include providing the connecting lines with an electrically insulating coating except at electric contact points with the thermocouple.

The method can include pressing the temperature sensor towards the mirror.

The method can include comparing a signal from the thermocouple with a reference value, and issuing an error signal if the signal exceeds the reference value.

In another general aspect, the invention features systems for monitoring a temperature of a component that include a temperature sensor having a thermocouple and a flexible printed circuit board. The component can be a mirror and the flexible printed circuit board tape can be disposed as an electrical insulator between the thermocouple and the mirror. The flexible printed circuit board tape is sufficiently thin so that the thermal insulation has no substantial influence on the temperature measurement.

Soiling of the mirror with a uniform coating or a single burn-in defect increases the absorption of a laser beam that impinges on the mirror, whereby more power is output through the mirror whose temperature increases. When the temperature increase exceeds a predetermined limit value, a temperature monitoring device of the system generates a corresponding error signal. Since the front side of the mirror is located in the laser radiation area, a rear side of the mirror or a circumferential area of the mirror is suited as a measuring point for the system.

The thermocouple can be a PT100 and a surface mounted device (SMD) component that is mounted, in particular, soldered, to exposed contact surfaces of the flexible printed circuit board tape. The connections of a thermocouple of SMD construction are designed as solder caps that are provided on both sides of the thermocouple. The connections can produce a short-circuit or a parallel resistance if there is direct contact between the connections and the electrically conducting mirror material, and such a short-circuit or parallel resistance can prevent proper measurement of the temperature. Accordingly, the flexible printed circuit board tape is disposed as an electrical insulator between the thermocouple and the component.

The flexible printed circuit board tape can be produced from a material that does not release gas, in particular, Teflon®. If the temperature sensor is arranged in a $CO_2$ laser, the flexible printed circuit board tape can also be produced from Teflon®, which is resistant to the gas atmosphere in the resonator.

In some implementations, the connecting lines extend as strip conductors on the flexible printed circuit board tape. The strip conductors are thereby provided with an electrically insulating coating, in particular a resist, except for their electrical contact points with the thermocouple, to electrically insulate the connecting lines to the outside.

In some implementations, the temperature monitoring systems include a spring element that urges the thermocouple towards the component to ensure good thermal contact between the temperature sensor and the component.

If one or more deflecting mirror(s), of, e.g., a folded $CO_2$ laser including several deflection mirrors is/are thought to be soiled or have burn-in defects, all deflecting mirrors are generally replaced as a precaution. To this end, the vacuum system of the gas laser resonator is opened with the consequence that particles may get into the resonator and soil it. Soiling of the resonator can, in turn, produce another mirror defect. The mirror supporting surfaces are diamond milled and can be scratched by particles that get between the mirror and the support when the mirror is exchanged. These scratches can result in an undefined mirror abutment and thereby in maladjustment of the resonator.

In another general aspect, a gas laser resonator includes at least two mirrors and a system of the design described herein for monitoring the temperature of at least one mirror. If a mirror is soiled, an increased amount of power is absorbed on the mirror, the absorbed power increases the temperature on the mirror, and that increased temperature is detected by the temperature monitoring system.

Advantageously, the temperature sensor is in thermal contact with the rear side or the circumferential area of the monitored mirror.

With particular preference, each deflecting mirror of the gas laser resonator is associated with a temperature sensor of the temperature monitoring system. When one single mirror is soiled (e.g., due to burn-in of a particle) this mirror can be detected and selectively replaced. In addition to the reduction in number of mirrors that must be replaced, the vacuum system of the gas laser resonator is opened for a shorter time, thus reducing the danger of further resonator soiling. The mirror supports of the remaining mirrors are not scratched because only the damaged mirrors are replaced.

Further advantages of the invention can be extracted from the description and the drawing. The features mentioned herein may be used individually or collectively in arbitrary combination. The embodiments shown and described are not to be understood as exhaustive enumeration but have exemplary character for describing the invention.

DETAILED DESCRIPTION

Figure 1:
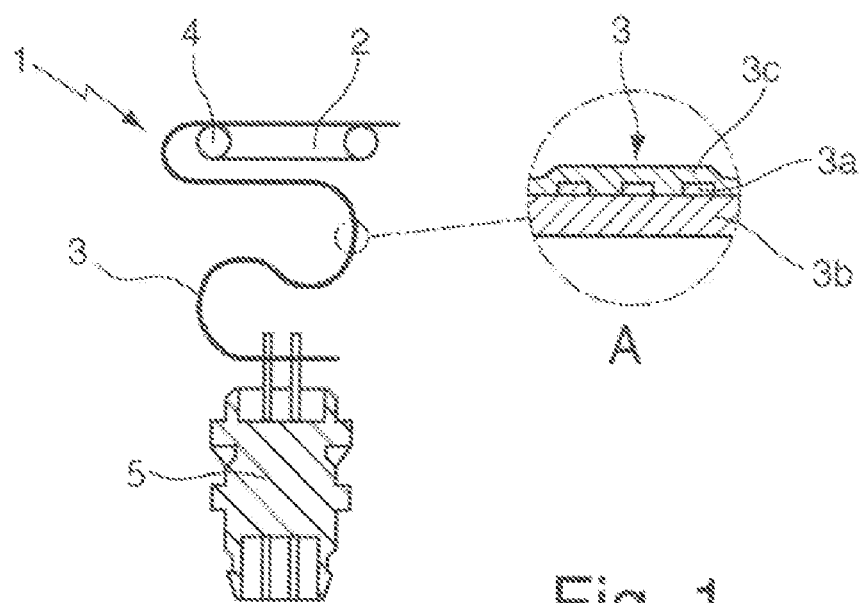
FIG. 1 is a diagram of a temperature sensor including a flexible printed circuit board tape with detail A being a cross-sectional view of the flexible printed circuit board tape.
Figure 2:
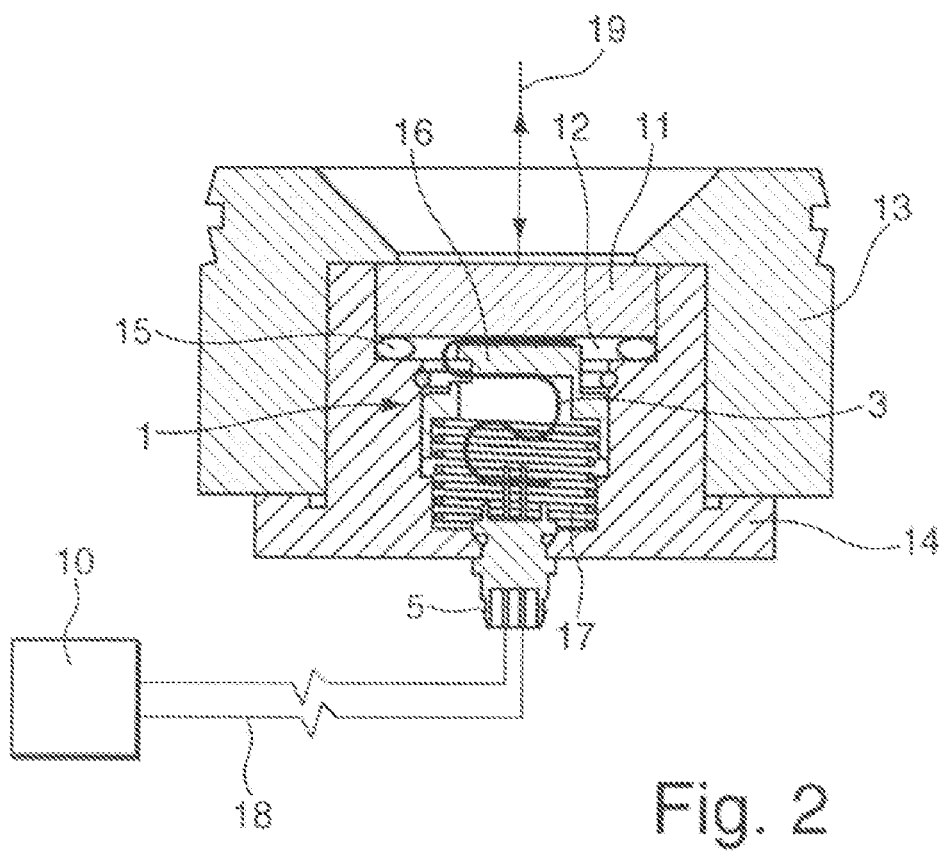
FIG. 2 is a cross-sectional view of a system for monitoring the temperature of a deflecting mirror including the temperature sensor of FIG. 1 and a temperature monitoring device.

The temperature sensor 1 shown in FIG. 1 has a thermocouple 2 and a flexible printed circuit board tape (flex board) 3. The thermocouple 2 can be a platinum thermocouple (e.g., a PT100). The thermocouple 2 is a surface mounted device (SMD) component and is soldered onto contacts of the flexible printed circuit board tape 3 (solder caps 4) in which the connecting lines (strip conductors) 3a of the thermocouple 2 are integrated. As shown in detail view A, the flexible printed circuit board tape 3 consists of an electrically insulating material 3b that does not gas out (e.g., Teflon®) and on which the strip conductors 3a extend. The printed circuit board tape 3 is electrically insulated by a solder resist 3c. All areas of the printed circuit board tape 3, except for the soldering caps 4, are surrounded by this resist. The flexible printed circuit board tape 3 has a connector 5 at its free end in order to connect the temperature sensor 1 to a temperature monitoring device 10, as shown in FIG. 2, through lines 18.

The temperature monitoring device 10 monitors the temperature of a deflecting mirror 11 using the temperature sensor 1 whose thermocouple 2 is disposed in thermal contact with the deflecting mirror 11. The deflecting mirror 11 is guided in an opening 12 of a mirror receptacle 14 such that it can be axially displaced, and is pressed into abutment on a mirror holder 13 by means of an axial spring 15 that is supported on the mirror receptacle 14. As shown in FIG. 2, the temperature sensor 1, and, in particular, the thermocouple 2, is in thermal contact with a rear side of the mirror 11. Furthermore, the thermocouple 2 is disposed between the rear side of the deflecting mirror 11 and a temperature sensor carrier 16 that is guided in the mirror receptacle 14 such that it can be axially displaced, and is pressed towards the deflecting mirror 11 by a spring element (e.g., a helical spring) 17. The thermocouple 2 is thereby pressed to the deflecting mirror 11 because of force applied by the spring element 17 to ensure good thermal contact between the temperature sensor 1 and the deflecting mirror 11. The flexible printed circuit board tape 3 can be clamped to the temperature sensor carrier 16. The temperature sensor carrier 16 is made from a non-conducting material (e.g., PEEK).

The solder caps 4 of the thermocouple 2 are provided on both sides of the thermocouple 2. The solder caps 4 would produce a short-circuit or parallel resistance if they were to come into direct contact with the electrically conducting rear side of the deflecting mirror 11. Such a short-circuit would prevent a proper temperature measurement. Thus, the flexible printed circuit board tape 3 is disposed, as an electrical insulator, between the thermocouple 2 and the deflecting mirror 11, as shown in FIG. 1. The flexible printed circuit board tape 3 is sufficiently thin so that its thermal insulating effect has no substantial influence on the temperature measurement. Moreover, the flexible printed circuit board tape 3 can compensate for a motion of the deflecting mirror 11 of approximately 1 mm towards the axial spring 15; such displacement of the deflecting mirror 11 can be required for assembly/disassembly of the mirror 11.

Soiling of the mirror with a uniform coating or a single burn-in defect increases absorption of a laser beam 19 that impinges on the deflecting mirror 11, whereby more power is output through the deflecting mirror 11 and the temperature of the deflecting mirror 11 increases because of the increased absorption. When the temperature increase exceeds a predetermined limit value, the temperature monitoring device 10 generates a corresponding error signal.

Figure 3:
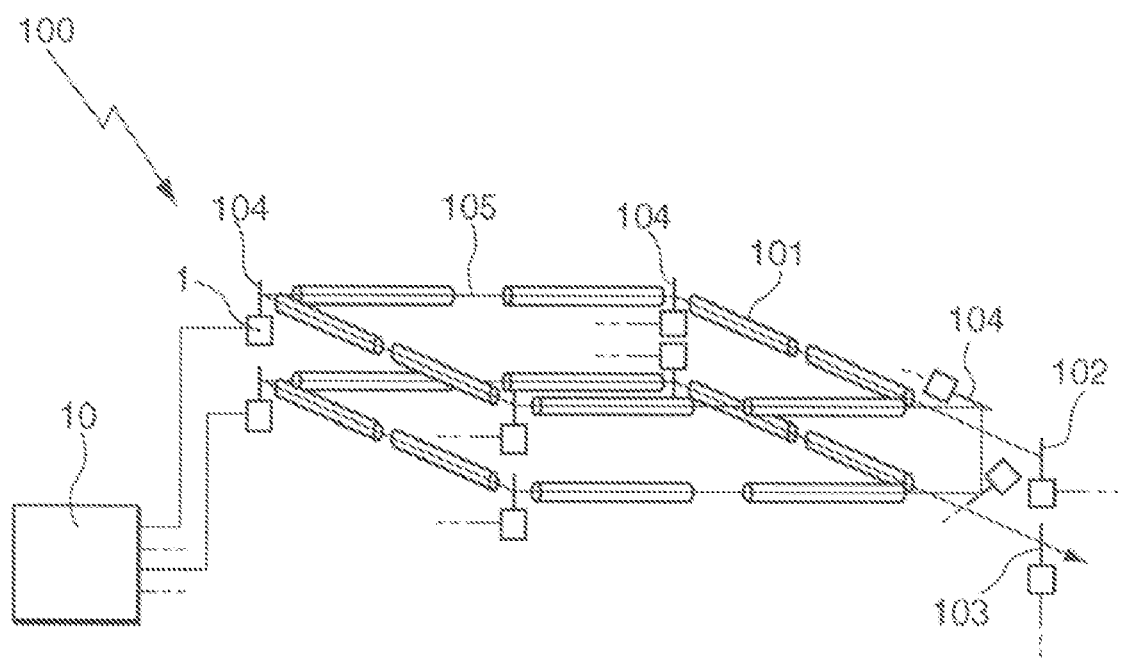
FIG. 3 is a diagram of a gas laser resonator including one or more mirrors whose temperature is monitored by the system of FIG. 2.

FIG. 3 shows a gas laser resonator 100 that is folded into a square shape, whose discharge tubes 101 are disposed in two planes. The gas laser resonator 100 has a rear mirror 102, a decoupling mirror 103, and eight deflecting mirrors 104 for guiding a laser beam 105. The rear mirror 102, the decoupling mirror 103, and the deflecting mirrors 104 each have a temperature sensor 1, which is connected to the temperature monitoring device 10. The temperature monitoring device 10 determines a spatially averaged temperature value for each mirror 102, 103, 104. The temperature value can be automatically or manually evaluated using the temperature monitoring device 10. The temperature monitoring device 10 compares the temperature value of a mirror with a reference value that can be pre-determined or input during the setting-up operation of the same mirror. The temperature monitoring device 10 can additionally, or alternatively, compare values between two or more mirrors. If the measured temperature of a mirror 102, 103, 104 exceeds the predetermined reference value, the temperature monitoring device 10 issues an error signal for this mirror, which can then be selectively replaced.

In other implementations, the temperature sensor 1 is in thermal contact with the circumferential area of the deflecting mirror 11, 102, 103, and 104. For example, for partially transmissive rear mirrors and decoupling mirrors, the temperature sensor 1 may be more suitably disposed on the circumferential area of the mirror, because the mirror rear side is not suited for temperature measurements due to the penetrating laser radiation.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A system for monitoring the temperature of a mirror, the system comprising a temperature sensor in thermal contact with the mirror, the temperature sensor comprising a thermocouple and connecting lines, wherein the thermocouple is mounted in an electrically conducting fashion onto a flexible printed circuit board tape in which the connecting lines are integrated,
wherein the flexible printed circuit board tape is disposed as an electrical insulator between the thermocouple and the mirror.

2. The temperature monitoring system of claim 1, wherein the thermocouple is a PT100 thermocouple.

3. The temperature monitoring system of claim 1, further comprising a connector at an end of the flexible printed circuit board tape.

4. The temperature monitoring system of claim 1, further comprising a spring element that presses the temperature sensor towards the mirror.

5. The temperature monitoring system of claim 1, wherein the thermocouple is a surface mounted device component that is mounted to exposed contact surfaces of the flexible printed circuit board tape.

6. The temperature monitoring system of claim 5, wherein the thermocouple is soldered to exposed contact surfaces of the flexible printed circuit board tape.

7. The temperature monitoring system of claim 1, wherein the flexible printed circuit board tape comprises a material that does not gas out.

8. The temperature monitoring system of claim 7, wherein the flexible printed circuit board tape comprises Teflon.

9. The temperature monitoring system of claim 1, wherein the connecting lines extend as strip conductors on the flexible printed circuit board tape, and the strip conductors are provided with an electrically insulating coating except at electric contact points with the thermocouple.

10. The temperature monitoring system of claim 9, wherein the electrically insulating coating includes a resist.

11. The temperature monitoring system of claim 1, further comprising a temperature monitoring device that receives a signal from the thermocouple, compares the thermocouple signal with a reference value, and issues an error signal if the signal exceeds the reference value.

12. The temperature monitoring system of claim 11, further comprising a connector provided at an end of the flexible printed circuit board tape and coupled to the temperature monitoring device.

13. A gas laser resonator comprising:
at least one mirror, and
a system for monitoring the temperature of at least one mirror, the system comprising a temperature sensor in thermal contact with the at least one mirror, the temperature sensor comprising a thermocouple and connecting lines,
wherein the thermocouple is mounted in an electrically conducting fashion onto a flexible printed circuit board tape in which the connecting lines are integrated and the flexible printed circuit board tape is disposed as an electrical insulator between the thermocouple and the at least one mirror.

14. The gas laser resonator of claim 13, wherein the temperature sensor is in thermal contact with a rear side or a circumferential area of the at least one mirror.

15. The gas laser resonator of claim 13, where each mirror is associated with a temperature sensor of the temperature monitoring system.

16. The gas laser resonator of claim 13, wherein the temperature monitoring system includes a temperature monitoring device that receives a signal from the thermocouple, compares the thermocouple signal with a reference value, issues an error signal if the signal exceeds the reference value.

17. A method for monitoring the temperature of a mirror, the method comprising:
   integrating connecting lines of a temperature sensor into a flexible printed circuit board tape;
   mounting a thermocouple of the temperature sensor in an electrically conducting fashion onto the flexible printed circuit board tape;
   placing the temperature sensor in thermal contact with the mirror; and
   disposing the flexible printed circuit board tape as an electrical insulator between the thermocouple and the mirror.

18. The method of claim 17, wherein mounting the thermocouple onto the flexible printed circuit board tape comprises mounting the thermocouple to exposed contact surfaces of the flexible printed circuit board tape.

19. The method of claim 17, further comprising attaching a connector at an end of the flexible printed circuit board tape.

20. The method of claim 17, further comprising providing the connecting lines with an electrically insulating coating except at electric contact points with the thermocouple.

21. The method of claim 17, further comprising pressing the temperature sensor towards the mirror.

22. The method of claim 17, further comprising comparing a signal from the thermocouple with a reference value, and issuing an error signal if the signal exceeds the reference value.

\* \* \* \* \*